United States Patent [19]
Kasai

[11] Patent Number: 5,907,788
[45] Date of Patent: May 25, 1999

[54] SEMICONDUCTOR DEVICE CAPABLE OF EASILY FILLING CONTACT CONDUCTOR PLUG IN CONTACT HOLE

[75] Inventor: Naoki Kasai, Tokyo, Japan

[73] Assignee: NEC Corporation, Japan

[21] Appl. No.: 09/097,530

[22] Filed: Jun. 16, 1998

Related U.S. Application Data

[63] Continuation of application No. 08/736,187, Oct. 24, 1996, abandoned, which is a continuation of application No. 08/508,837, Jul. 28, 1995, abandoned.

[30] Foreign Application Priority Data

Jul. 29, 1994 [JP] Japan .................................. 6-177881

[51] Int. Cl.⁶ .............................................. H01L 21/4763
[52] U.S. Cl. .......................... 438/622; 438/626; 438/637
[58] Field of Search .................................. 438/622, 625, 438/626, 637, 675

[56] References Cited

U.S. PATENT DOCUMENTS

| | | | |
|---|---|---|---|
| 5,063,175 | 11/1991 | Broadbent | 438/626 |
| 5,110,762 | 5/1992 | Nakahara et al. | 438/626 |
| 5,258,329 | 11/1993 | Shibata | 438/637 |
| 5,262,353 | 11/1993 | Sun et al. | 438/622 |
| 5,403,781 | 4/1995 | Matsumoto et al. | 438/637 |
| 5,436,199 | 7/1995 | Brighton | 438/626 |
| 5,529,945 | 6/1996 | Rao | 438/622 |
| 5,571,751 | 11/1996 | Chung | 438/637 |
| 5,616,519 | 4/1997 | Ping | 438/626 |
| 5,702,482 | 12/1997 | Lee et al. | 438/626 |
| 5,728,626 | 3/1998 | Allman et al. | 438/626 |

OTHER PUBLICATIONS

T. Kikkawa, et al., "Quarter–Micron Interconnection Technologies for 256–Mbit Dynamic Random Access Memories", Jpn. J. Appl. Phys., vol. 32, Part I, No. 1B, Jan. 1993, pp. 338–346.

*Primary Examiner*—Kevin M. Picardat
*Attorney, Agent, or Firm*—Ostrolenk, Faber, Gerb & Soffen, LLP

[57] ABSTRACT

In a semiconductor device having an impurity diffusion layer in a surface part of a semiconductor surface and a first insulator layer formed on the semiconductor substrate and the impurity diffusion layer, the first insulator layer has a first recessed surface which defines a first contact hole. A first contact conductor plug is filled in the first contact hole. A second insulator layer is formed on the first insulator layer and a first upper plug surface of the first contact conductor plug. The second insulator layer has a second recessed surface which defines a second contact hole exposing the first upper plug surface. A second contact conductor plug is filled in the second contact hole to overlie the first upper plug surface and to be brought into contact with the second recessed surface. A conductor pad may be disposed between the first and the second contact conductor plugs.

4 Claims, 11 Drawing Sheets

SEMICONDUCTOR DEVICE CAPABLE OF EASILY FILLING CONTACT CONDUCTOR PLUG IN CONTACT HOLE

This is a continuation of patent application Ser. No. 08/736,187, filed Oct. 24, 1996, now abandoned, which is in turn a continuation of patent application Ser. No. 08/508,837, filed Jul. 28, 1995, now abandoned.

BACKGROUND OF THE INVENTION

This invention relates to a semiconductor device and a method of manufacturing the semiconductor device.

A conventional semiconductor device is described in "Japanese Journal of Applied Physics Part 1, the thirty-second volume, 1993, January, pp. 339–346". This semiconductor device comprises a semiconductor substrate, an impurity diffusion layer formed in the semiconductor substrate, a gate electrode on the semiconductor substrate, first through third insulator layers formed on the semiconductor substrate to have first and second recessed surface which define first and second contact holes exposing first and second predetermined areas of the impurity diffusion layer and the gate electrode, and first and second contact conductor plugs filled in the first and the second contact holes.

In the semiconductor device, inasmuch as aspect ratios of the first and the second contact holes are large, it is hardly possible to fill the first and the second contact conductor plugs in the first and the second contact holes.

SUMMARY OF THE INVENTION

It is therefore an object of the present invention to provide a semiconductor device which is capable of easily filling a contact conductor plug in a contact hole.

Other objects of this invention will become clear as the description proceeds.

According to a first aspect of this invention, there is provided a semiconductor device which comprises a semiconductor substrate having a principal surface; an impurity diffusion layer formed in a surface part of the semiconductor substrate for having impurities in the impurity diffusion layer which has an impurity diffusion surface; a first insulator layer formed on the principal surface and the impurity diffusion surface to have an upper insulator surface and a first recessed surface which defines a first contact hole exposing a first predetermined area of the impurity diffusion surface; a first contact conductor plug filled in the first contact hole to overlie the first predetermined area of the impurity diffusion surface and to be brought into contact with the first recessed surface, the first contact conductor plug having an upper plug surface; a conductor pad formed on the upper plug surface and a predetermined surrounding area of the upper insulator surface, the conductor pad having an upper pad surface which is larger than the upper plug surface; a second insulator layer formed on the upper insulator surface and the upper pad surface to have a second recessed surface which defines a second contact hole exposing a second predetermined area of the upper pad surface; and a second contact conductor plug filled in the second contact hole to overlie the second predetermined area of the upper pad surface and to be brought into contact with the second recessed surface.

According to a second aspect of this invention, there is provided a semiconductor device which comprises a semiconductor substrate having a principal surface; an impurity diffusion layer formed on a surface part of the semiconductor substrate for having impurities in the impurity diffusion layer which has an impurity diffusion surface; a first insulator layer formed on the principal surface and the impurity diffusion surface to have an upper insulator surface and a first recessed surface which defines a first contact hole exposing a predetermined area of the impurity diffusion surface; a first contact conductor plug filled in the first contact hole to overlie the predetermined area of the impurity diffusion surface and to be brought into contact with the first recessed surface, the first contact conductor plug having an upper plug surface; a second insulator layer formed on the upper insulator surface to have a second recessed surface which defines a second contact hole exposing the upper plug surface; and a second contact conductor plug filled in the second contact hole to overlie the upper plug surface and to be brought into contact with the second recessed surface.

According to a third aspect of this invention, there is provided a semiconductor device which comprises a semiconductor substrate having a principal surface; an impurity diffusion layer formed in a surface part of the semiconductor substrate for having impurities in the impurity diffusion layer which has an impurity diffusion surface; a first insulator layer formed on the principal surface and the impurity diffusion surface for having a first upper insulator surface; a gate electrode formed on the first upper insulator surface for having an upper gate surface; a second insulator layer formed on the first upper insulator surface and the upper gate surface, the second insulator layer having a second upper insulator surface and a first recessed surface which defines a first contact hole exposing a first predetermined area of the upper gate surface, the first and the second insulator layers having a second recessed surface which defines a second contact hole exposing a second predetermined area of the impurity diffusion surface; a first contact conductor plug filled in the first contact hole to overlie the first predetermined area of the upper gate surface and to be brought into contact with the first recessed surface, the first contact conductor plug having a first upper plug surface; a second contact conductor plug filled in the second contact hole to overlie the second predetermined area of the impurity diffusion surface and to be brought into contact with the second recessed surface, the second contact conductor plug having a second upper plug surface; a third insulator layer formed on the second upper insulator surface to have third and fourth recessed surfaces which define third and fourth contact holes exposing the first and the second upper plug surfaces, the third insulator layer having a third upper insulator surface; a third contact conductor plug filled in the third contact hole to overlie the first upper plug surface and to be brought into contact with the third recessed surface; and a fourth contact conductor plug filled in the fourth contact hole to overlie the second upper plug surface and to be brought into contact with the fourth recessed surface.

According to a fourth aspect of this invention, there is provided a semiconductor device which comprises a semiconductor substrate having a principal surface; an impurity diffusion layer formed in a surface part of the semiconductor substrate for having impurities in the impurity diffusion layer which has an impurity diffusion surface; a first insulator layer formed on the principal surface and the impurity diffusion surface for having a first upper insulator surface; a gate electrode formed on the first upper insulator surface for having an upper gate surface; a second insulator layer formed on the first upper insulator surface and the upper gate surface, the second insulator layer having a second upper insulator surface and a first recessed surface which defines a first contact hole exposing a first predetermined area of the upper gate surface, the first and the second insulator layers having a second recessed surface which defines a second contact hole exposing a second predetermined area of the impurity diffusion surface; a first contact conductor plug filled in the first contact hole to overlie the first predetermined area of the upper gate surface and to be brought into contact with the first recessed surface, the first contact conductor plug having a first upper plug surface; a second contact conductor plug filled in the second contact hole to overlie the second predetermined area of the impurity diffusion surface and to be brought into contact with the second recessed surface, the second contact conductor plug having a second upper plug surface; a first conductor pad formed on the first upper plug surface and a first predetermined surrounding area of the second upper insulator surface, the first conductor pad having a first upper pad surface which is larger than the first upper plug surface; a second conductor pad formed on the second upper plug surface and a second predetermined surrounding area of the second upper insulator surface, the second conductor pad having a second upper pad surface which is larger than the second upper plug surface; a third insulator layer formed on the second upper insulator surface and the first and the second upper pad surfaces to have third and fourth recessed surfaces which define third and fourth contact holes exposing first and second predetermined area of the first and the second upper pad surfaces; a third contact conductor plug filled in the third contact hole to overlie the first predetermined area of the first upper pad surface and to be brought into contact with the third recessed surface; and a fourth contact conductor plug filled in the fourth contact hole to overlie the second predetermined area of the second upper pad surface and to be brought into contact with the fourth recessed surface.

According to a fifth aspect of this invention, there is provided a method of manufacturing a semiconductor device that comprises the steps of preparing a semiconductor substrate to have a principal surface; forming an impurity diffusion layer in a surface part of the semiconductor substrate to have impurities in the impurity diffusion layer which has an impurity diffusion surface; forming a first insulator layer on the principal surface and the impurity diffusion surface to have an upper insulator surface and a first recessed surface which defines a first contact hole exposing a first predetermined area of the impurity diffusion surface; filling a first contact conductor plug in the first contact hole to overlie the first predetermined area of the impurity diffusion surface and to be brought into contact with the first recessed surface, the first contact conductor plug having an upper plug surface; forming a conductor pad on the upper plug surface and a predetermined surrounding area of the upper insulator surface to have an upper pad surface which is larger than the upper plug surface; forming a second insulator layer on the upper insulator surface and the upper pad surface to have a second recessed surface which defines a second contact hole exposing a second predetermined area of the upper pad surface; and filling a second contact conductor plug in the second contact hole to overlie the second predetermined area of the upper pad surface and to be brought into contact with the second recessed surface.

According to a sixth aspect of this invention, there is provided a method of manufacturing a semiconductor device that comprises the steps of preparing a semiconductor substrate to have a principal surface; forming an impurity diffusion layer on a surface part of the semiconductor substrate to have impurities in the impurity diffusion layer which has an impurity diffusion surface; forming a first insulator layer on the principal surface and the impurity diffusion surface to have an upper insulator surface and a first recessed surface which defines a first contact hole exposing a predetermined area of the impurity diffusion surface; filling a first contact conductor plug in the first contact hole to overlie the predetermined area of the impurity diffusion surface and to be brought into contact with the first recessed surface, the first contact conductor plug having an upper plug surface; forming a second insulator layer on the upper insulator surface to have a second recessed surface which defines a second contact hole exposing the upper plug surface; and filling a second contact conductor plug in the second contact hole to overlie the upper plug surface and to be brought into contact with the second recessed surface.

According to a seventh aspect of this invention, there is provided a method of manufacturing a semiconductor device that comprises the steps of preparing a semiconductor substrate to have a principal surface; forming an impurity diffusion layer in a surface part of the semiconductor substrate to have impurities in the impurity diffusion layer which has an impurity diffusion surface; forming a first insulator layer on the principal surface and the impurity diffusion surface to have a first upper insulator surface; forming a gate electrode on the first upper insulator surface to have an upper gate surface; forming a second insulator layer on the first upper insulator surface and the upper gate surface to have a second upper insulator surface and a first recessed surface which defines a first contact hole exposing a first predetermined area of the upper gate surface, the first and the second insulator layers having a second recessed surface which defines a second contact hole exposing a second predetermined area of the impurity diffusion surface; filling a first contact conductor plug in the first contact hole to overlie the first predetermined area of the upper gate surface, to be brought into contact with the first recessed surface, and to have a first upper plug surface; filling a second contact conductor plug in the second contact hole to overlie the second predetermined area of the impurity diffusion surface, to be brought into contact with the second recessed surface, and to have a second upper plug surface; forming a third insulator layer on the second upper insulator surface to have third and fourth recessed surfaces which define third and fourth contact holes exposing the first and the second upper plug surfaces and to have a third upper insulator surface; filling a third contact conductor plug in the third contact hole to overlie the first upper plug surface and to be brought into contact with the third recessed surface; and filling a fourth contact conductor plug in the fourth contact hole to overlie the second upper plug surface and to be brought into contact with the fourth recessed surface.

According to an eighth aspect of this invention, there is provided a method of manufacturing a semiconductor device that comprises the steps of preparing a semiconductor substrate to have a principal surface; forming an impurity diffusion layer in a surface part of the semiconductor substrate to have impurities in the impurity diffusion layer which has an impurity diffusion surface; forming a first insulator layer on the principal surface and the impurity diffusion surface to have a first upper insulator surface; forming a gate electrode on the first upper insulator surface to have an upper gate surface; forming a second insulator layer on the first upper insulator surface and the upper gate surface, to have a second upper insulator surface and a first recessed surface which defines a first contact hole exposing a first predetermined area of the upper gate surface, the first and the second insulator layers having a second recessed surface which defines a second contact hole exposing a second predetermined area of the impurity diffusion surface; filling a first contact conductor plug in the first contact hole to overlie the first predetermined area of the upper gate surface and to be brought into contact with the first recessed surface, the first contact conductor plug having a first upper plug surface; filling a second contact conductor plug in the second contact hole to overlie the second predetermined area of the impurity diffusion surface and to be brought into contact with the second recessed surface, the second contact conductor plug having a second upper plug surface; forming a first conductor pad on the first upper plug surface and a first predetermined surrounding area of the second upper insulator surface to have a first upper pad surface which is larger than the first upper plug surface; forming a second conductor pad on the second upper plug surface and a second predetermined surrounding area of the second upper insulator surface to have a second upper pad surface which is larger than the second upper plug surface; forming a third insulator layer on the second upper insulator surface and the first and the second upper pad surfaces to have third and fourth recessed surfaces which define third and fourth contact holes exposing first and second predetermined area of the first and the second upper pad surfaces; filling a third contact conductor plug in said third contact hole to overlie the first predetermined area of the first upper pad surface and to be brought into contact with the third recessed surface; and filling a fourth contact conductor plug in the fourth contact hole to overlie the second predetermined area of the second upper pad surface and to be brought into contact with the fourth recessed surface.

According to this invention, inasmuch as aspect ratios of contact holes are small, it is possible to easily fill contact conductor plugs in the contact holes.

DESCRIPTION OF THE PREFERRED EMBODIMENTS

Figure 1:
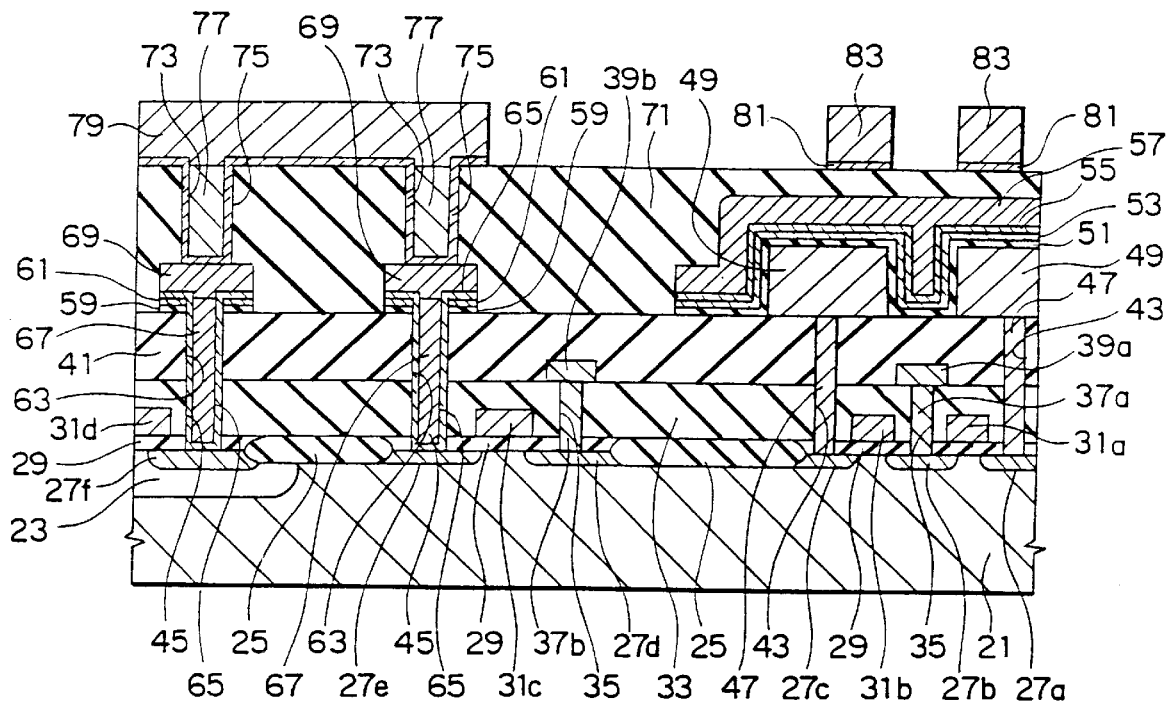
FIG. 1 is a schematic vertical sectional view of a semiconductor device according to a first embodiment of this invention.
Figure 2:
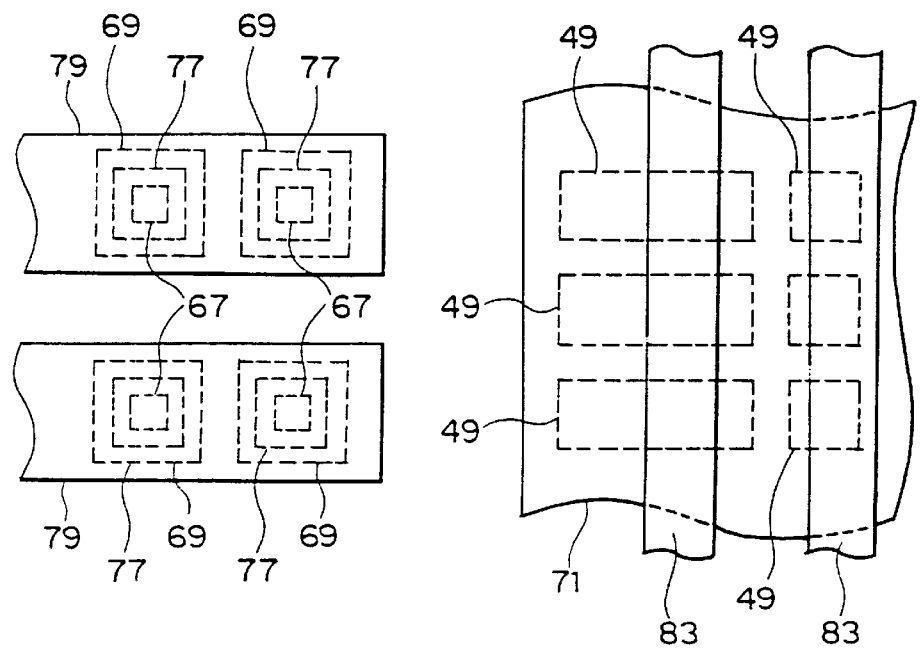
FIG. 2 is a partial plan view of the semiconductor device illustrated in FIG. 1.

Referring to FIGS. 1 and 2, the description will proceed to a semiconductor device according to a first embodiment of this invention.

In FIG. 1, the semiconductor device comprises a semiconductor substrate 21. For example, the semiconductor substrate 21 is made of p-type silicon. An n-type well layer 23 is formed in a part of the semiconductor substrate 21. A plurality of first insulator layers 25 are formed on the principal surface of the semiconductor substrate 21 and have first upper insulator surfaces. A plurality of impurity diffusion layers 27a, 27b, 27c, 27d, 27e, and 27f are formed in parts of the semiconductor substrate 21 that are positioned between the first insulator layers 25. The impurity diffusion layers 27a to 27f have upper impurity diffusion surfaces. A plurality of second insulator layers 29 are formed on the impurity diffusion surfaces and the principal surfaces and positioned between the first insulator layers 25. The second insulator layers 29 have second upper insulator surfaces. A plurality of gate electrodes 31a, 31b, 31c, and 31d are formed on the second upper insulator surfaces of the second insulator layers 29 and have upper gate surfaces.

A third insulator layer 33 is formed on the upper gate surfaces and the first and the second upper insulator surfaces. The third insulator layer 33 has a third upper insulator surface. The second and the third insulator layers 29 and 33 have first recessed surfaces 35 which define first contact holes exposing first predetermined areas of the upper impurity diffusion surfaces of the impurity diffusion layers 27b and 27d. First contact plugs 37a and 37b are filled in the first contact holes to overlie the first predetermined areas of the impurity diffusion layers 27b and 27d and to be brought into contact with the first recessed surfaces 35. The first contact plugs 37a and 37b have first upper plug surfaces. Bit line layers 39a and 39b are formed on the first upper plug surfaces and first surrounding areas of the third upper insulator surfaces. The bit line layers 39a and 39b have upper bit surfaces. A fourth insulator layer 41 is formed on the upper bit surfaces and the third upper insulator surface and has a fourth upper insulator surface. The fourth insulator layer 41 has second and third recessed surfaces 43 and 45 which define second and third contact holes exposing second predetermined areas of the impurity diffusion surfaces of the impurity diffusion surfaces 27a, 27c, 27e, and 27f. Second contact conductor plugs 47 are filled in the second contact holes to overlie the impurity diffusion surfaces of the impurity diffusion layers 27a and 27c and to be brought into contact with the second recessed surfaces 43. The second contact conductor plugs 47 have second upper plug surfaces.

Capacitor electrodes 49 are formed on the second upper plug surfaces and second surrounding areas of the fourth upper insulator surface. The capacitor electrodes 49 have upper capacitor electrode surfaces. A fifth insulator layer 51 is formed on the upper capacitor electrode surfaces and third surrounding areas of the fourth insulator layer 41. The fifth insulator layer 51 has a fifth upper insulator surface. A first barrier metal layer 53 is formed on the fifth upper insulator surface and has a first upper barrier surface. A first metal layer 55 is formed on the first upper bimetal surface and has an upper metal surface. A cell plate electrode 57 is formed on the first upper metal surface and has an upper plate electrode surface and has upper plate surface.

Sixth insulator layers 59 are formed on predetermined areas of the fourth upper insulator surface. Second barrier metal layers 61 are formed on the sixth insulator layers 59 and has second upper barrier surfaces. The second, the third, the fourth, and the sixth insulator layers 29, 33, 41, and 59 and the second barrier metal layers 61 have third recessed surfaces 63 which define third contact holes exposing third predetermined areas of the impurity diffusion surfaces of the impurity diffusion layers 27e and 27f. Second metal layers 65 are formed on the third predetermined areas of the impurity diffusion layers 27e and 27f, the third recessed surfaces 63 and the second upper barrier surfaces. The second metal layers 65 have second upper metal surfaces and fourth recessed surfaces which define fourth contact holes. Third contact conductor plugs 67 are filled in the fourth contact holes to be brought into contact with the fourth recessed surfaces. The third contact conductor plugs 67 have third upper plug surfaces.

Conductor pads 69 are formed on the third upper plug surfaces and the second upper metal surfaces and have upper pad surfaces. A seventh insulator layer 71 is formed on the upper plate surface, the fourth upper insulator surface, and the upper pad surfaces. The seventh insulator layer 71 has a seventh upper insulator surface. The seventh insulator layer 71 has fifth recessed surfaces 73 which define fifth contact holes exposing predetermined pad ares of the conductor pads 69. A third metal layer 75 is formed on the fifth recessed surfaces 73 and a first surrounding area of the seventh upper insulator surface. The third metal layer 75 has a third upper metal surface and sixth recessed surfaces which define sixth contact holes. Fourth contact conductor plugs 77 are filled in the sixth contact holes to be brought into contact with the sixth recessed surfaces. The fourth contact conductor plugs 77 have fourth upper plug surfaces. First aluminum layers 79 are formed on the fourth upper plug surfaces and a surrounding area of the seventh upper insulator surface. Fourth metal layers 81 are formed on predetermined areas of the seventh upper insulator surface and have fourth upper metal surfaces. Second aluminum layers 83 are formed on the fourth upper metal surfaces.

A source or a drain of a transistor is implemented by the impurity diffusion layer 27a, 27b, 27c, 27d, 27e, or 27f. A memory cell is implemented by the impurity diffusion layers 27a, 27b, and 27c, the gate electrodes 31a and 31b, the first contact conductor plug 37a, the bit line layer 39a, the second contact conductor plugs 47, the capacitor electrodes 49, the cell plate electrode 57, and the second aluminum layers 83. A peripheral circuit is implemented by the impurity diffusion layers 27d, 27e, and 27f, the first contact conductor plug 37b, the gate electrodes 31c and 31d, the third contact conductor plugs 67, the conductor pads 69, the fourth contact conductor plugs 77, and the first aluminum layers 79.

Referring to FIGS. 3(A) to 3(E) together with FIGS. 1 and 2, the description will proceed to a method of manufacturing the semiconductor device illustrated in FIGS. 1 and 2. Similar parts are designated by like reference numerals.

Figure 3A:
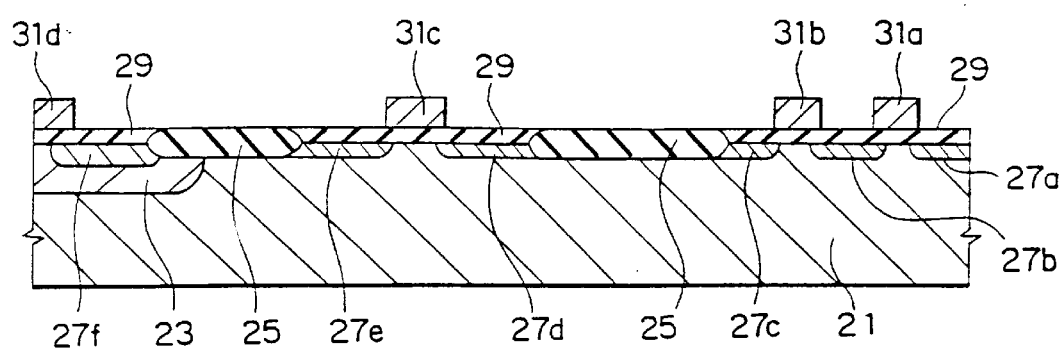
FIGS. 3(A) to (E) are schematic vertical sectional views for explaining a method of manufacturing the semiconductor device illustrated in FIG. 1.

In FIG. 3(A), the semiconductor substrate 21 was prepared in the known manner to have the principal surface. The semiconductor substrate 21 was made of p-type silicon. The N well layer 23 was formed in the part of the semiconductor substrate 21. The first insulator layers 25 were formed on the principal surface of the semiconductor substrate 21 by using a method of local oxidation. The second insulator layers 29 were formed on the principal surface by using a method of thermal oxidation. The gate electrodes 31a to 31d were formed on the first and the second upper insulator surfaces of the first and the second insulator layers 25 and 29. The gate electrodes 31a to 31d were made of a polysilicon layer and a tungsten silicide layer laminated on the polysilicon layer. The impurity diffusion layers 27a to 27f were formed in the parts of the semiconductor substrate 21 by implanting impurities in the parts.

Figure 3B:
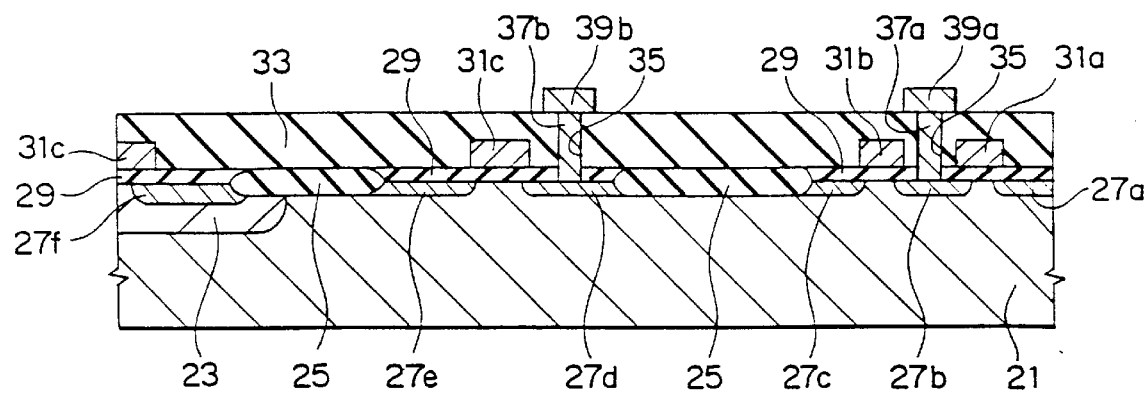

In FIG. 3(B), the third insulator layer 33 was formed on the upper gate surfaces and the first and the second upper insulator surfaces by using a method of chemical vapor deposition (CVD). The third upper insulator surface of the third insulator layer 33 was formed by using a method of chemical mechanical polishing (CMP). The first recessed surfaces 35 were formed in the second and the third insulator layers 29 and 33 by using a method of dry etching. The first contact conductor plugs 37a and 37b were filled in the first contact holes by using the methods of CVD and dry etching. The first contact conductor plugs 37a and 37b were made of polysilicon having n-type impurities. The bit line layers 39a and 39b were formed on the first upper plug surfaces of the first contact conductor plugs 37a and 37b. The bit line layers 39a and 39b were made of tungsten silicide. Each of the bit line layers 39a and 39b has a thickness of 150 nm.

Figure 3C:
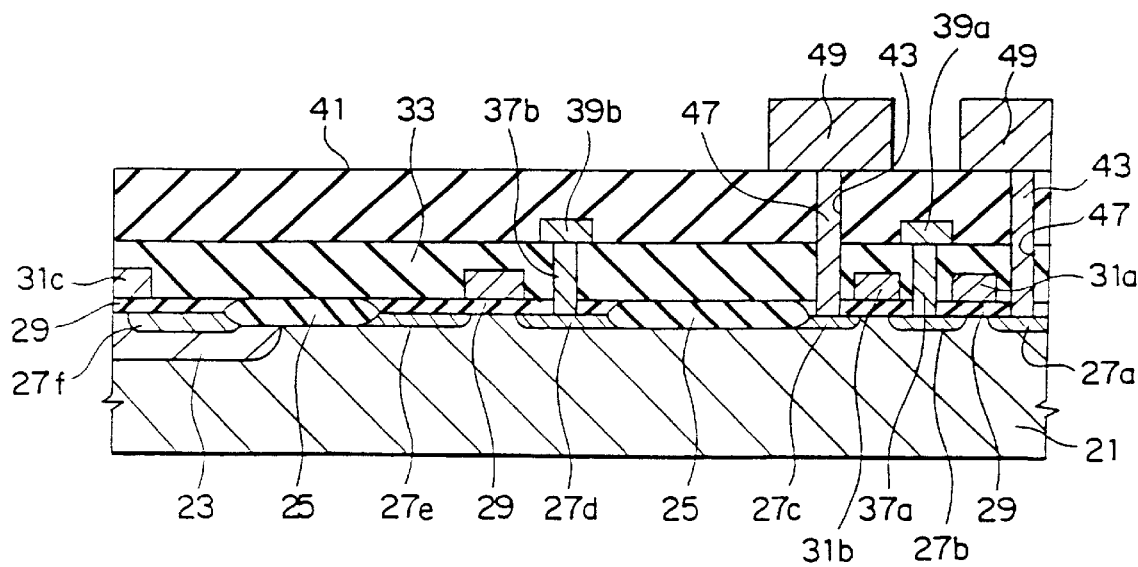

In FIG. 3(C), the fourth insulator layer 41 was formed on the third upper insulator layer 33 and the bit line layers 39a and 39b by using the methods of CVD and CMP. The fourth insulator layer 41 was made of silicon oxide or silicon oxide film including boron glass and phosphorus glass. The second recessed surfaces 43 were formed in the fourth, the third, and the second insulator layers 41, 33, and 29 by using the method of dry etching. The second contact conductor plugs 47 were filled in the second contact holes by using the methods of CVD and dry etching. The second contact conductor plugs 47 was made of polysilicon having n-type impurities. The capacitor electrodes 49 were formed on the second upper plug surfaces and the second surrounding areas of the fourth upper insulator surface. The capacitor electrodes 49 were made of polysilicon layer having n-type impurities.

Figure 3D:
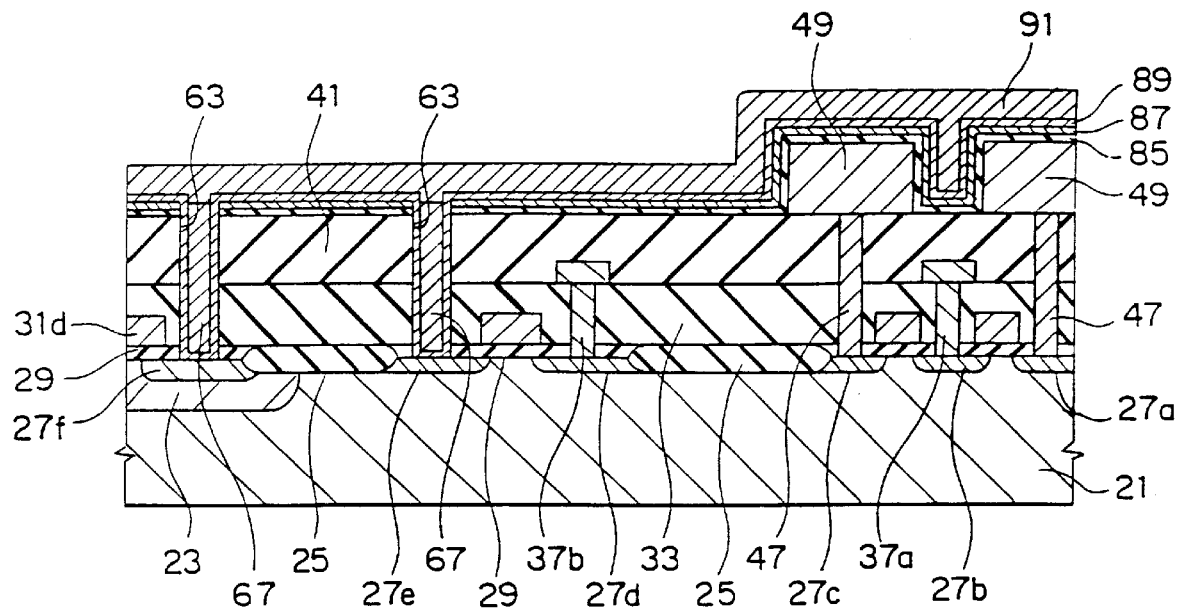

In FIG. 3(D), an eighth insulator layer 85 was formed on the fourth insulator layer 41 and the capacitor electrodes 49 to have an eighth insulator surface. The eighth insulator 85 was made of nitride silicon and has a thickness of 5 to 10 nm. A third barrier metal layer 87 was formed on the eighth insulator layer 85. The third barrier metal layer 87 was made of nitride titanium and has a thickness of 20 to 50 nm. The third recessed surfaces 63 were formed in the third barrier metal layer 87, the eighth insulator layer 87, and the second to the fourth insulator layers 29, 33, and 41 by using the method of dry etching. A third metal layer 89 was formed on the third recessed surfaces 63 and the third barrier metal layer 87 by using a method of sputter. The third metal layer 89 was made of titanium and has a thickness of about 50 nm. A tungsten layer 91 was formed on the third metal layer 89 by using the method of CVD which uses gases of $WF_6$ and $SiH_4$. The tungsten layer 91 has a thickness of about 200 nm.

Figure 3E:
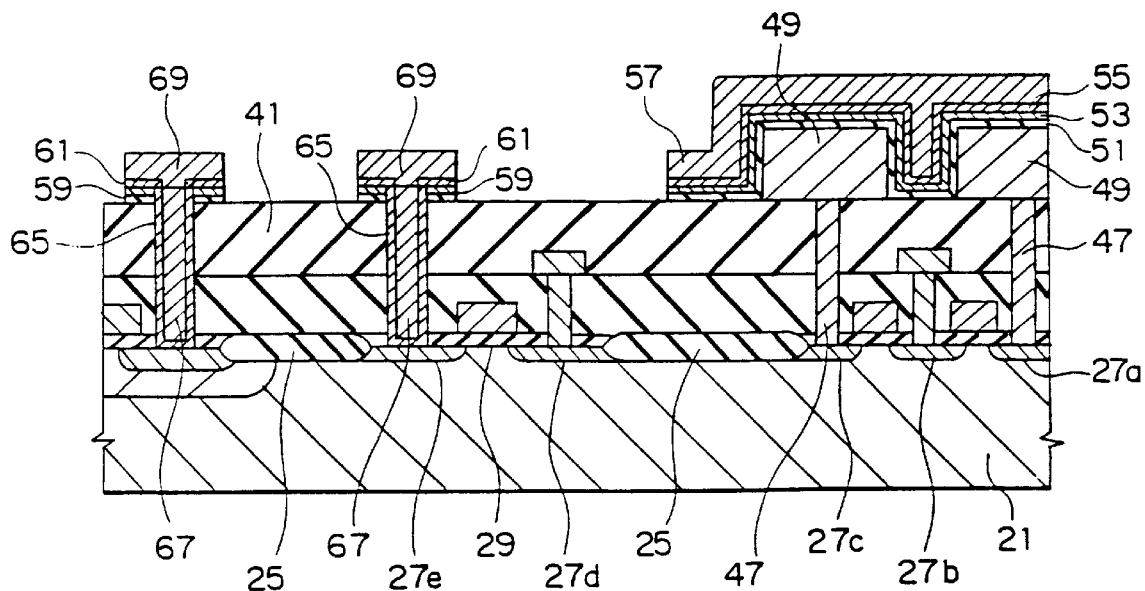

In FIG. 3(E), the fifth insulator layer 51, the first barrier metal layer 53, the first metal layer 55, the cell plate electrode 57, the sixth insulator layers 59, the second barrier metal layers 61, the second metal layers 65, the third contact conductor plugs 67, and the conductor pads 69 were formed by using methods of photolithography and dry etching which uses gases of $SF_6$, $Cl_2$, and HBr. Impurities of n-type were injected in one of the conductor pads 69. Impurities of p-type were injected in another of the conductor pads 69.

In FIG. 1, the seventh insulator 71 was formed on the upper plate surface, the fourth upper insulator surface, and the upper pad surfaces by using the methods of CVD and CMP. The fifth recessed surfaces 73 were formed in the seventh insulator 71 by using the method of dry etching. The third metal layer 75 was formed on the fifth recessed surfaces 73 and the first surrounding area of the seventh upper insulator surface by using the methods of sputter and dry etching. At the same time, the fourth metal layers 81 were formed on the seventh upper insulator surface. The third metal layer 75 was made of titanium and has the third upper metal surface and the sixth recessed surface which define the sixth contact holes. The fourth contact conductor plugs 77 was filled in the sixth contact holes by using the methods of sputter and dry etching. The first and the second aluminum layers 79 and 83 were formed on the fourth contact conductor plugs 77 and the fourth metal layers 81 by using the methods of sputter and dry etching.

In the semiconductor device illustrated in FIG. 1, inasmuch as the contact holes have small aspect ratios and are small, it is possible to densely form contact conductor plugs.

Figure 4:
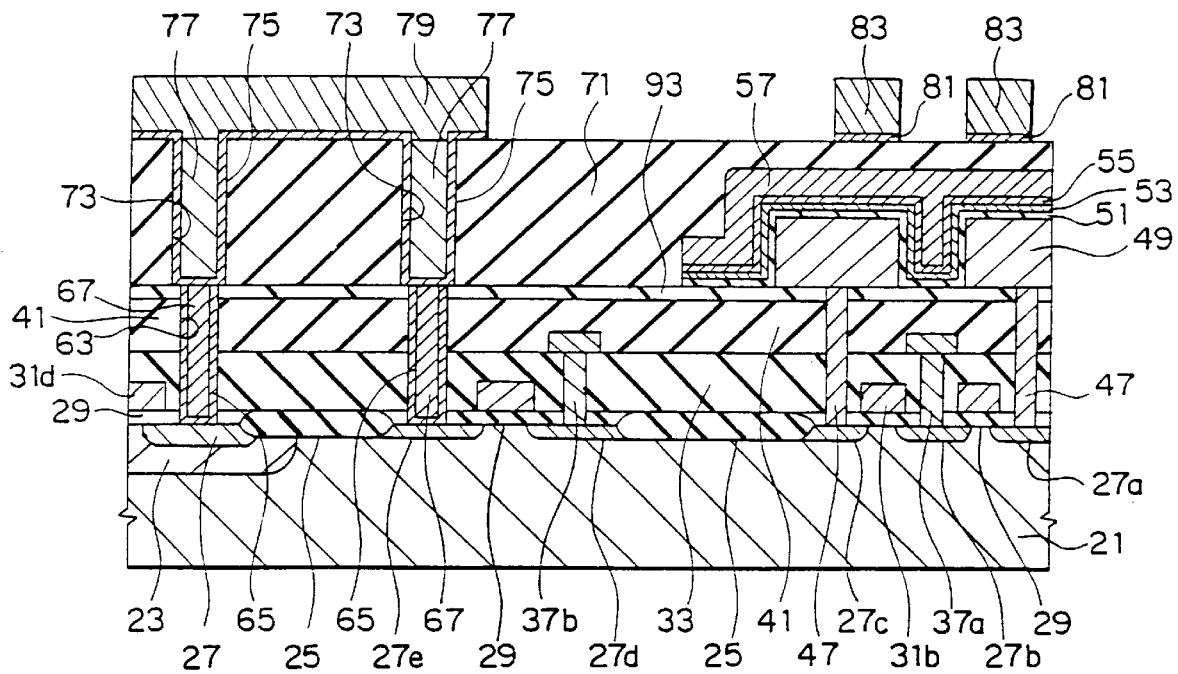
FIG. 4 is a schematic vertical sectional view of a semiconductor device according to a second embodiment of this invention.
Figure 5:
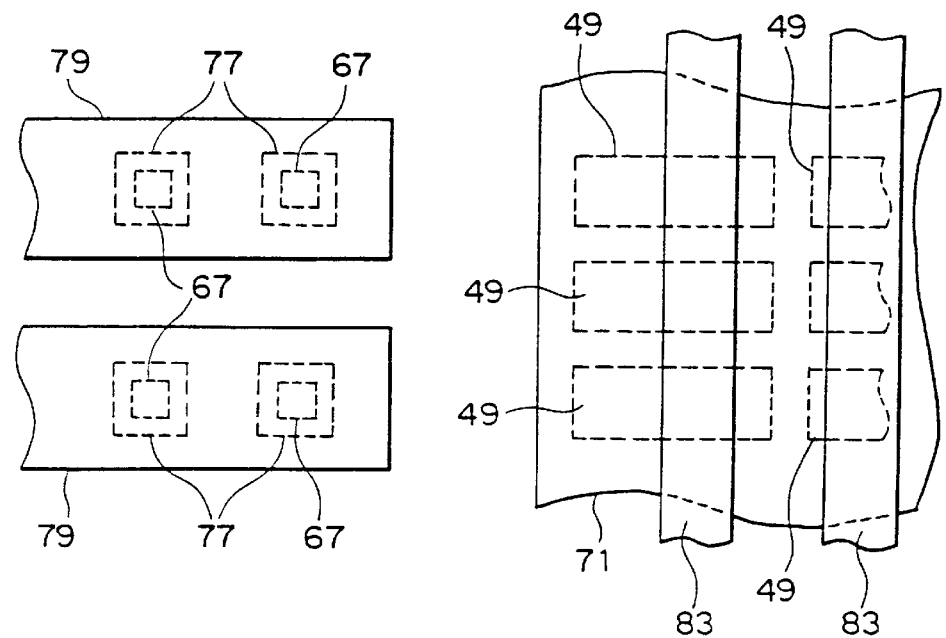
FIG. 5 is a partial plan view of the semiconductor device illustrated in FIG. 4.

Referring to FIGS. 4 and 5, the description will proceed to a semiconductor device according to a second embodiment of this invention. Similar parts are designated by like reference numerals.

In FIG. 4, a ninth insulator layer 93 is formed on the fourth upper insulator surface of the fourth insulator layer 41 and has a ninth upper insulator surface. The ninth, the fourth, the third, and the second insulator layers 93, 41, 33, and 29 have the second and the third surfaces 43 and 63. The capacitor electrodes 49 are formed on the ninth upper insulator surface of the ninth insulator layer 93. The fifth insulator layer 51 is formed on the ninth upper insulator surface. The seventh insulator layer 71 is formed on the ninth upper insulator surface and the cell plate electrode 57. The seventh insulator layer 71 has the fifth recessed surfaces 73 which define the fifth holes exposing the third upper plug surfaces of the third contact conductor plugs 67, upper surfaces of the second metal layers 65, and predetermined surrounding areas of the ninth upper insulator surface of the ninth insulator layer 93. The third metal layer 75 is formed on the fifth recessed surfaces 73, the third upper plug surfaces of the third contact conductor plugs 67, the upper surfaces of the second metal layers 65, and the predetermined surrounding areas of the ninth upper insulator surface. The ninth insulator layer 93 was made of a silicon oxide layer which includes an excessive amount of silicon. The ninth insulator layer 93 may be made of nitride silicon.

Referring to FIG. 4, the description will proceed to a method of manufacturing the semiconductor. Similar parts are designated by like reference numerals.

The semiconductor substrate 21 was prepared in the known manner. The N well layer 23, the first insulator layers 25, the impurity diffusion layers 27a to 27e, the second insulator layers 29, the gate electrodes 31a to 31d, the third insulator layer 33, the first recessed surfaces 35, the first contact conductor plugs 37a and 37b, the bit line layers 39a and 39b, and the fourth insulator layer 41 was formed in the manner illustrated in FIGS. 3(A) to 3(C). The ninth insulator layer 93 was formed on the fourth upper insulator surface of the fourth insulator layer 41. The ninth insulator layer 93 was made of the silicon oxide layer which includes an excessive amount of silicon. The ninth insulator layer 93 may be made of nitride silicon. It is assumed that the ninth insulator layer 93 is made of the silicon oxide layer. The silicon oxide layer preferably contains silicon of 2 to 12 at %.

The capacitor electrodes 49 were formed on the ninth upper insulator surface of the ninth insulator layer 93 in the manner illustrated in FIG. 3(C). The eighth insulator layer 85 and the third barrier metal layer 87 were formed in the manner illustrated in FIG. 3(D). The third recessed surface 63 was formed by using the method of dry etching. The third metal layers 89 and the tungsten layer 91 were formed in the manner illustrated in FIG. 3(D).

The fifth insulator layer 51, the first barrier metal layer 53, the first metal layer 55, the cell plate electrode 57, and the second metal layers 65 were formed in the manner illustrated in FIG. 3(E). The third contact conductor plugs 67 were filled by using the methods of sputter and dry etching. The fifth insulator layer 71 was formed by using the methods of CVD and CMP. The fifth recessed surface 73 was formed by using the method of dry etching.

The third metal layers 75, the fourth contact conductor plugs 77, the second metal layers 81, and the first and the second aluminum layers 79 and 83 were formed in the manner illustrated in FIG. 1.

In the semiconductor device illustrated in FIG. 4, inasmuch as the semiconductor device does not have the conductor pads, density of the contact conductor plugs is higher than that of the contact conductor plugs illustrated in FIG. 1.

Figure 6:
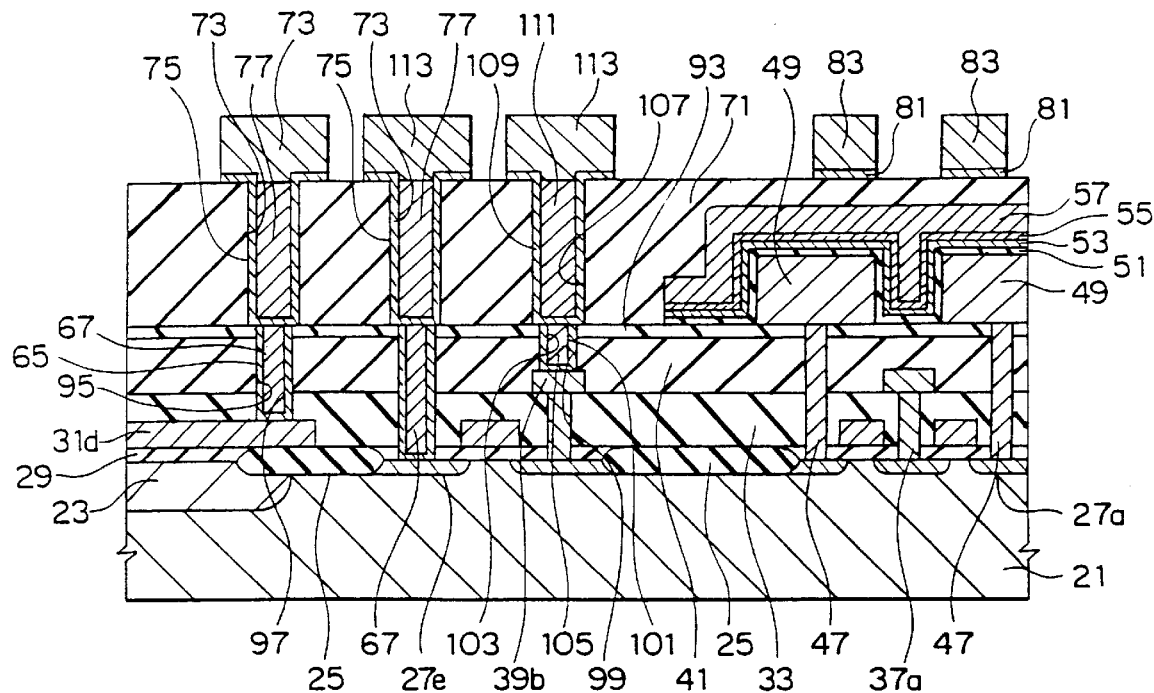
FIG. 6 is a schematic vertical sectional view of a semiconductor device according to a third embodiment of this invention.

Referring to FIG. 6, the description will proceed to a semiconductor device according to a third embodiment of this invention. Similar parts are designated by like reference numerals.

The gate electrode 31d is formed on predetermined areas of the first and the second insulator layers 25 and 29. The third and the fourth insulator layers 33 and 41 have a seventh recessed surface 95 which defines seventh contact holes exposing a seventh predetermined area of the upper gate surface of the gate electrode 31d. The second metal layer 65 is formed on the seventh predetermined area of the gate electrode 31d and the seventh recessed surface 95. The second metal layer 65 has an eighth recessed surface 97 which defines an eighth contact hole. The third contact conductor plug 67 is filled in the eighth contact hole to be brought into contact with the eighth recessed surface 97.

The fourth and the ninth insulator layers 41 and 93 have a ninth recessed surface 99 which defines a ninth contact hole exposing a predetermined bit area of the upper bit surface of the bit line layer 39b. A fifth metal layer 101 is formed on the predetermined bit area of the bit line layer 39b and the ninth recessed surface 99. The fifth metal layer 101 has a fifth upper metal surface and a tenth recessed surface 103 which defines a tenth contact hole. A fifth contact conductor plug 105 is filled in the tenth contact hole to be brought into contact with the tenth recessed surface 103. The fifth contact conductor plug 105 has a fifth upper plug surface.

The fifth insulator layer 71 has an eleventh recessed surface 107 which defines an eleventh contact hole exposing the fifth upper plug surface of the fifth contact conductor plug 105, the fifth upper metal surface of the fifth metal layer 101, and a predetermined surrounding area of the ninth insulator layer 93. A sixth metal layer 109 is formed on the fifth upper plug surface of the fifth contact conductor plug 105, the fifth upper metal surface of the fifth metal layer 101, the predetermined surrounding area of the ninth insulator layer 93, and the eleventh recessed surface 107. The sixth metal layer 109 has a sixth upper metal surface and a twelfth recessed surface which defines a twelfth contact hole. A sixth contact conductor plug 111 is filled in the twelfth contact hole to be brought into contact with the twelfth recessed surface 111. The sixth contact conductor plug 111 has a sixth upper plug surface. The third aluminum layers 113 are formed on the fourth upper plug surfaces of the fourth contact conductor plugs 77 and the sixth upper plug surface of the sixth contact conductor plug 111.

Referring to FIGS. 7(A) to 7(E) together with FIG. 6, the description will proceed to a method of manufacturing the semiconductor device illustrated in FIG. 6. Similar parts are designated by like reference numerals.

Figure 7A:
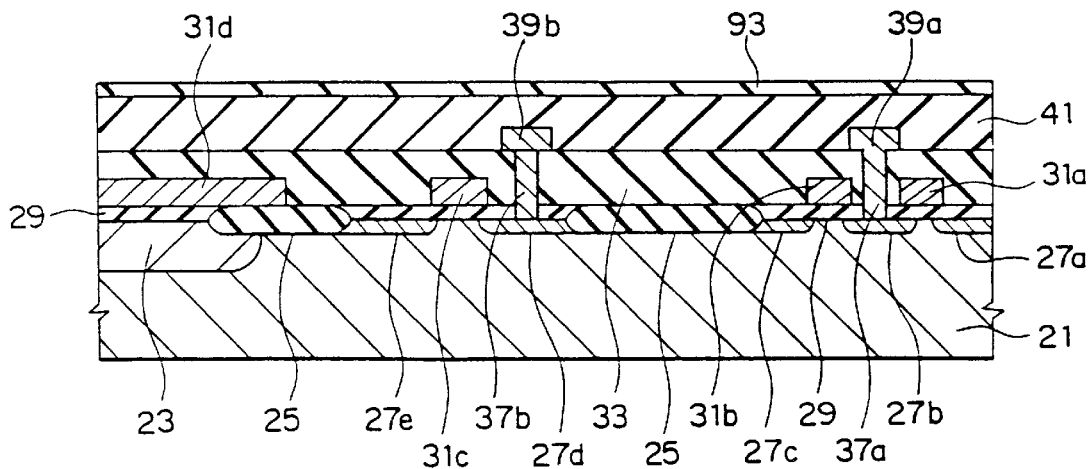
FIGS. 7(A) to (E) are schematic vertical sectional views for explaining a method of manufacturing the semiconductor device illustrated in FIG. 6.

In FIG. 7(A), the semiconductor substrate 21 was prepared in the known manner. The N well layer 23, the first insulator layers 25, the impurity diffusion layers 27a to 27e, the second insulator layers 29, the gate electrodes 31a to 31d, the third insulator layer 33, the first recessed surfaces 35, the first contact conductor plugs 37a and 37b, the bit line layers 39a and 39b, and the fourth insulator layer 41 was formed in the manner illustrated in FIGS. 3(A) to 3(C). The ninth insulator layer 93 was formed on the fourth upper insulator surface of the fourth insulator layer 41. The ninth insulator layer 93 was made of the silicon oxide layer which includes an excessive amount of silicon. The ninth insulator layer 93 may be made of nitride silicon. It is assumed that the ninth insulator layer 93 is made of the silicon oxide layer. The silicon oxide layer preferably contains silicon of 2 to 12 at %.

Figure 7B:
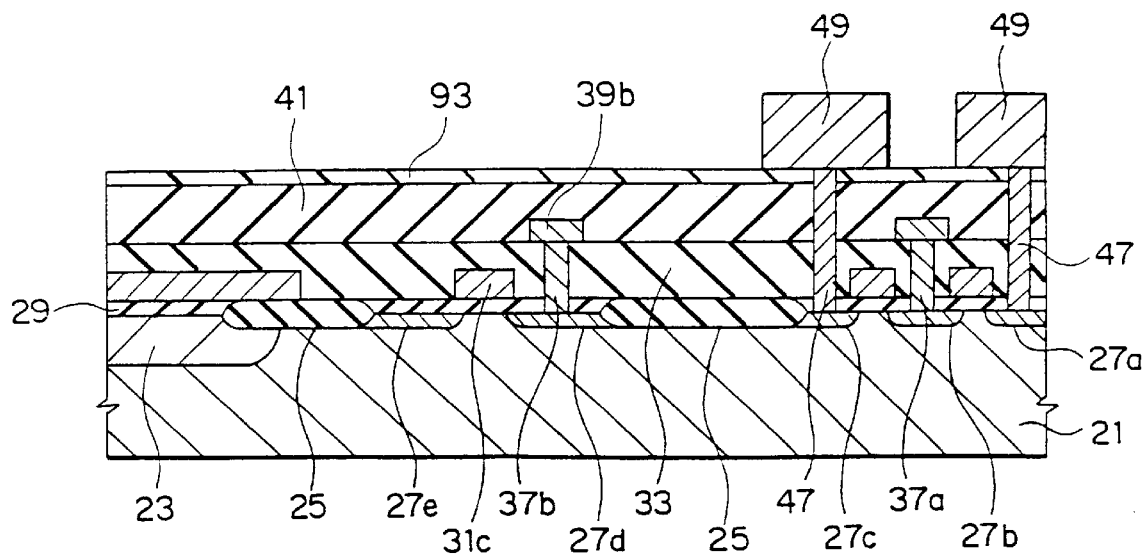

In FIG. 7(B), the capacitor electrodes 49 were formed on the ninth upper insulator surface of the ninth insulator layer 93 in the manner illustrated in FIG. 3(C).

Figure 7C:
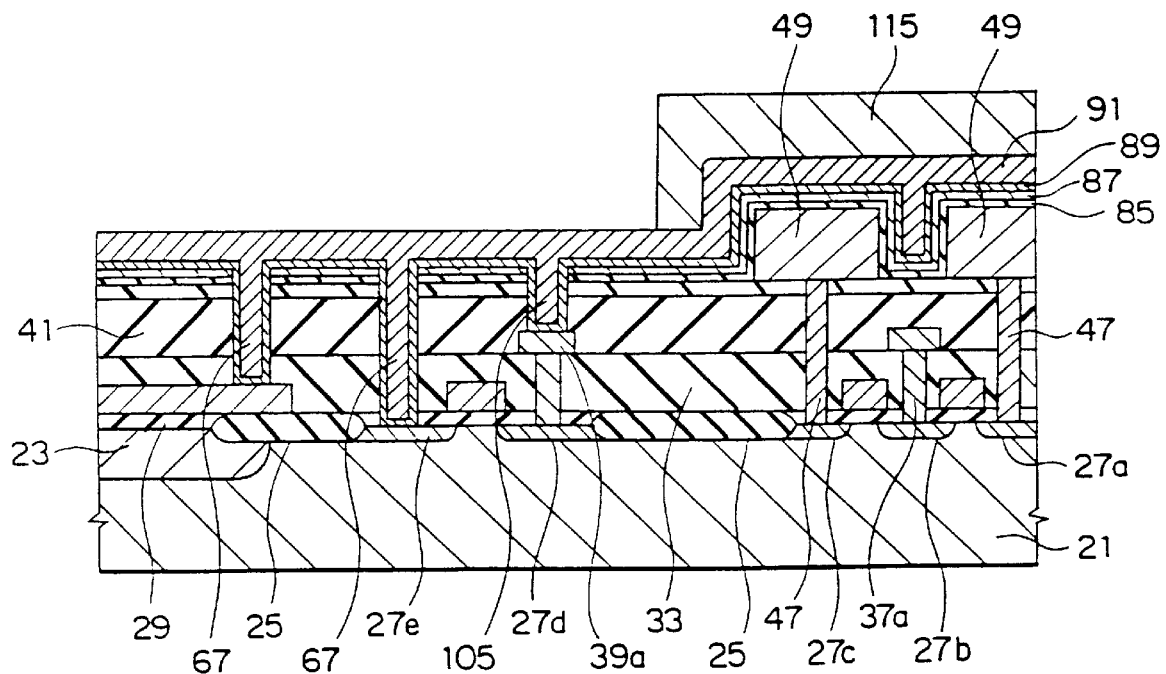

In FIG. 7(C), the eighth insulator layer 85 and the third barrier metal layer 87 were formed in the manner illustrated in FIG. 3(D). The third recessed surface 63, the seventh recessed surface 95, and the ninth recessed surface 99 were formed by using the method of dry etching. The third metal layers 89 and the tungsten layer 91 were formed in the manner illustrated in FIG. 3(D). A resist mask 115 was formed on the tungsten layer 91.

Figure 7D:
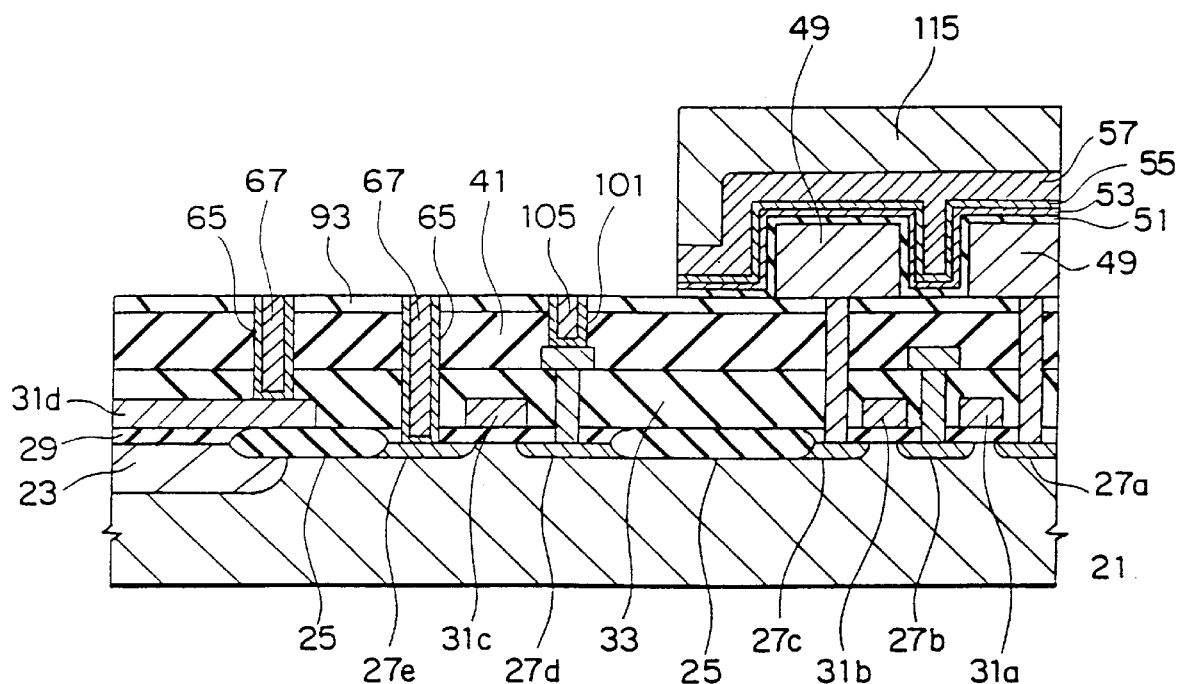

In FIG. 7(D), the fifth insulator layer 51, the first barrier metal layer 53, the first metal layer 55, the cell plate electrode 57, the second metal layers 65, and the fifth metal layer 101 were formed in the manner illustrated in FIG. 3(E). The third and the fifth contact conductor plugs 67 and 105 were filled by using the methods of sputter and dry etching.

Figure 7E:
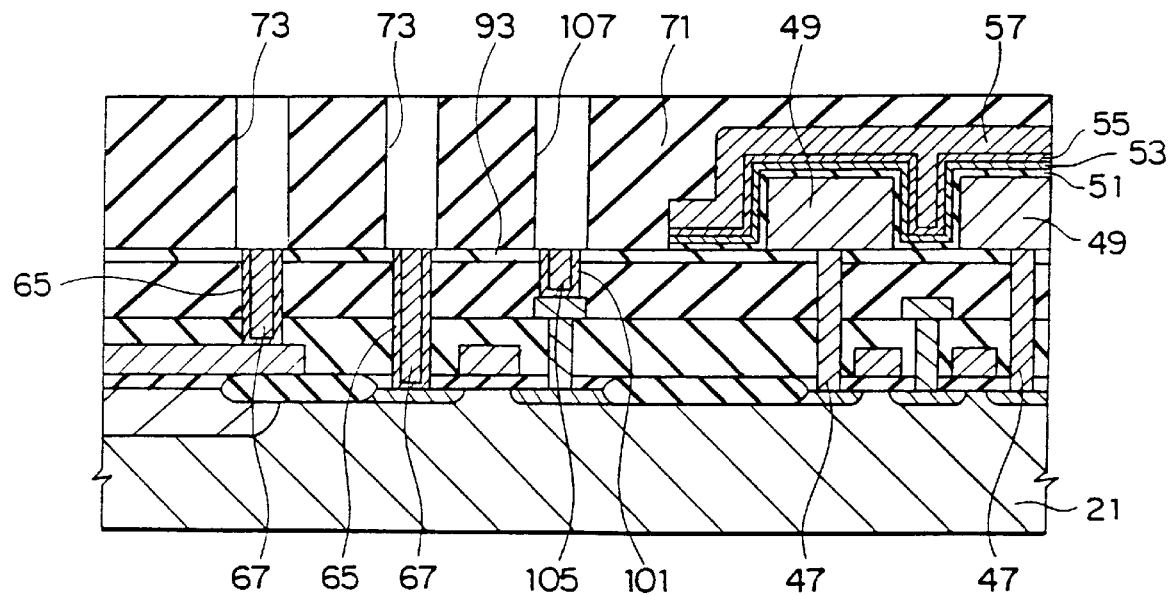

In FIG. 7(E), the resist mask 115 was taken away from the cell plate electrode 57. The fifth insulator layer 71 was formed by using the methods of CVD and CMP. The fifth recessed surfaces 73 and the eleventh recessed surface 107 were formed by using the method of dry etching.

In FIG. 6, the third metal layers 75, the sixth metal layer 109, the fourth contact conductor plugs 77, the sixth contact conductor plug 111, the second metal layers 81, the second aluminum layers 83, and the third aluminum layers 113 were formed in the manner illustrated in FIG. 1.

Figure 8:
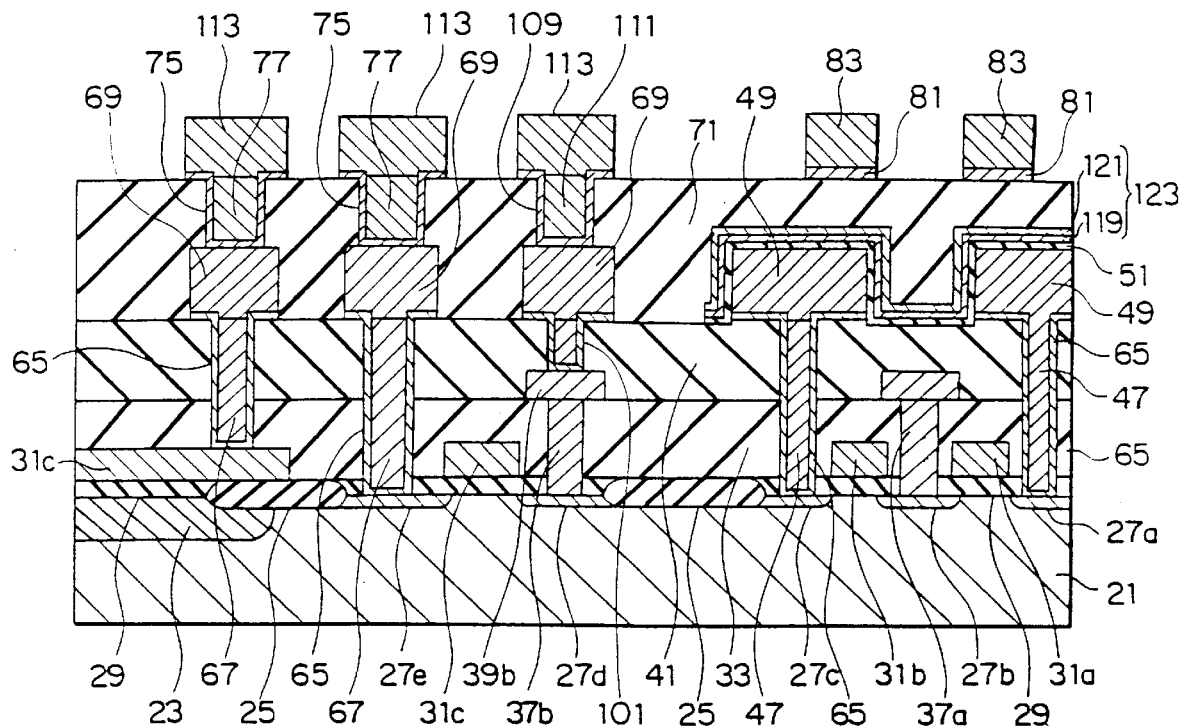
FIG. 8 is a schematic vertical sectional view of a semiconductor device according to a fourth embodiment of this invention.

Referring to FIG. 8, the description will proceed to a semiconductor device according to a fourth embodiment of this invention. Similar parts are designated by like reference numerals.

The second metal layers 65 is formed on the second recessed surfaces 43 and a predetermined surrounding area of the fourth insulator surface of the fourth insulator layer 41. The second metal layers 65 have the second upper metal surfaces and the fourth recessed surfaces which define the fourth contact holes. The second contact conductor plugs 47 are filled in the fourth recessed surfaces to be brought into contact with the fourth recessed surfaces.

The conductor pads 69 are formed on the third contact conductor plugs 67, the second upper metal surfaces of the second metal layers 65, the fifth contact conductor plug 105, and the fifth upper metal surface of the fifth metal layer 101. The fifth insulator layer 71 has the fifth recessed surfaces 73 and the eleventh recessed surface 107 which define the fifth contact holes and the eleventh contact hole exposing predetermined pad areas of the conductor pads 69. The third metal layers 75 are formed on the predetermined pad areas of the conductor pads 69 and the fifth recessed surfaces 73. The sixth metal layer 109 is formed on the predetermined pad area of the conductor pads 69 and the eleventh recessed surface 107.

Referring to FIGS. 9(A) to 9(F) together with FIG. 8, the description will proceed to a method of manufacturing the semiconductor device illustrated in FIG. 8. Similar parts are designated by like reference numerals.

Figure 9A:
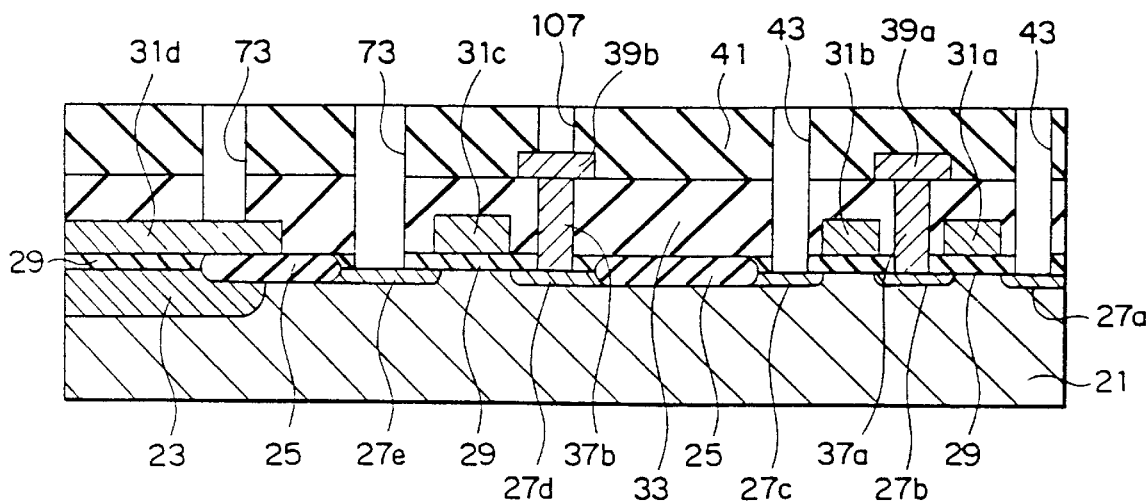
FIGS. 9(A) to (F) are schematic vertical sectional views for explaining a method of manufacturing the semiconductor device illustrated in FIG. 8.

In FIG. 9(A), the semiconductor substrate 21 was formed in the known manner. The N well layer 23, the first insulator layers 25, the impurity diffusion layers 27a to 27e, the second insulator layers 29, the gate electrodes 31a to 31d, the third insulator layer 33, the first recessed surfaces 35, the first contact conductor plugs 37a and 37b, the bit line layers 39a and 39b, and the fourth insulator layer 41 were formed in the manner illustrated in FIGS. 3(A), 3(B), and 3(C). The second, the third, the seventh, and the eleventh recessed surfaces 43, 73, and 107 were formed by using the method of dry etching.

Figure 9B:
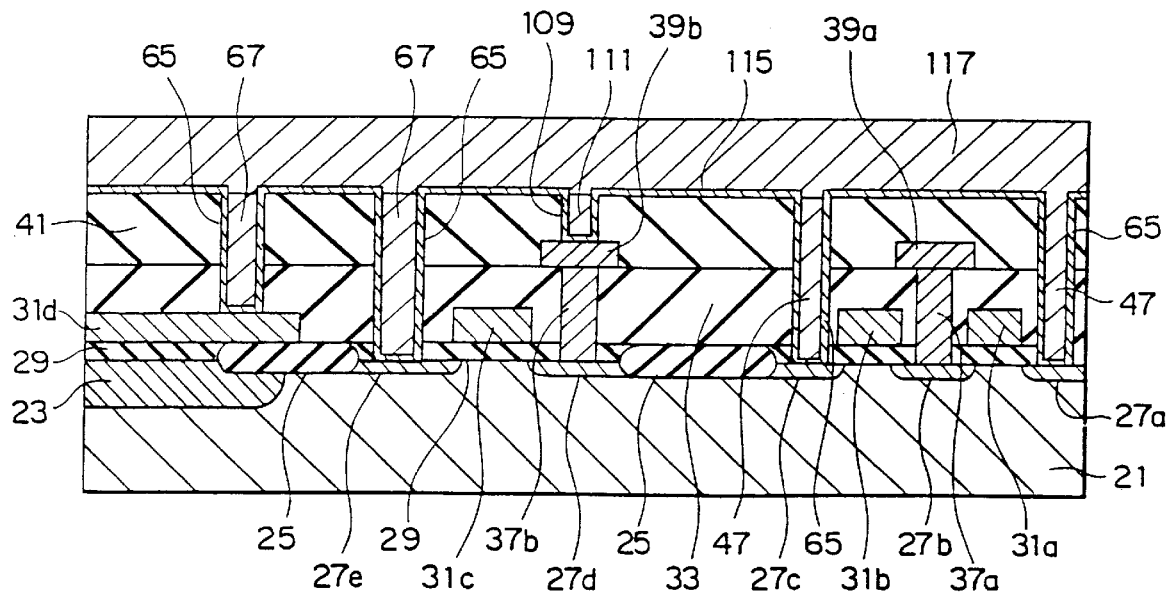

In FIG. 9(B), a titanium layer 115 was formed by using the method of CVD. A nitride titanium layer 117 was formed, by using the method of CVD, to form the second metal layers 65, the second, the third, and the fifth contact conductor plugs 47, 67, and 111.

Figure 9C:
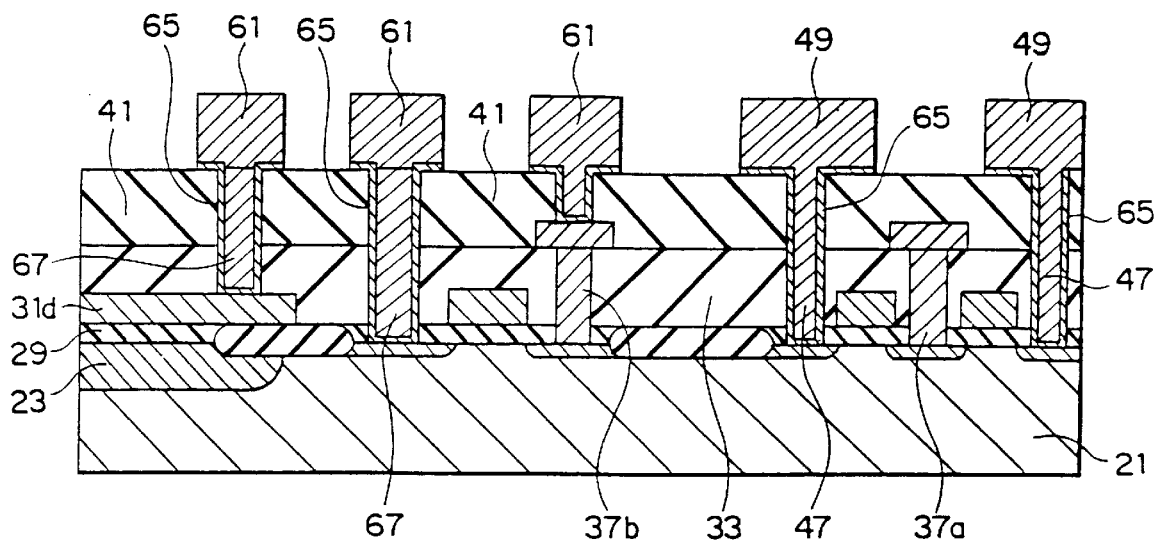

In FIG. 9(C), the capacitor electrodes and the conductor pads 69 were formed by using the method of dry etching.

Figure 9D:
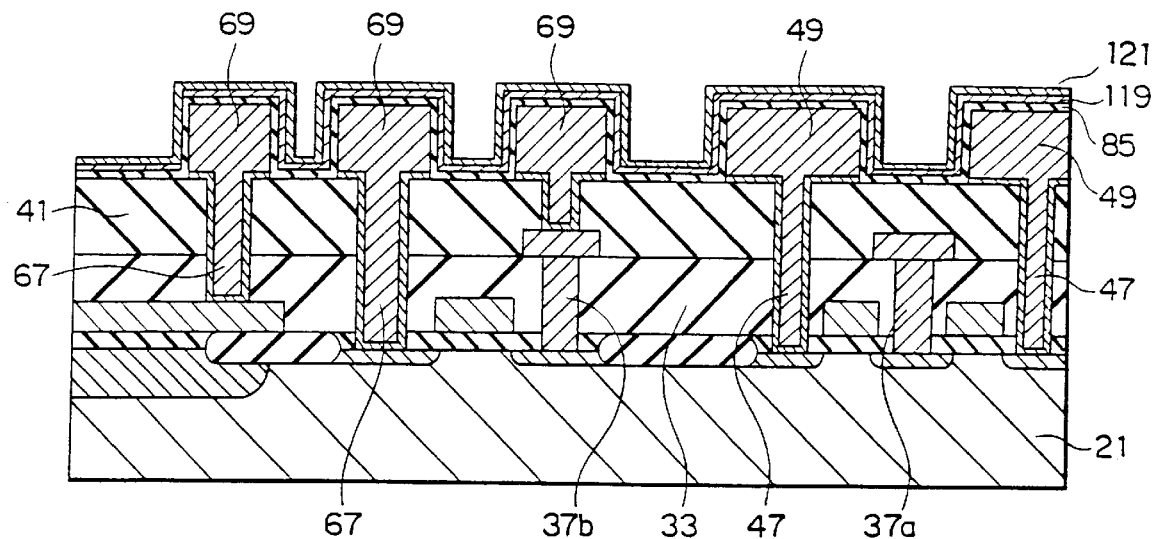

In FIG. 9(D), the eighth insulator layer 85 was formed on the fourth insulator layer 41, the capacitor electrodes 49, and the conductor pads 69 in the manner illustrated in FIG. 3(C). The eighth insulator layer 85 may be made of $Ta_2O_5$. The eighth insulator layer 85 has a thickness of about 10 nm. A nitride titanium layer 119 was formed on the eighth insulator layer 85 by using the method of sputter. The nitride titanium layer 119 has a thickness of about 100 nm. A tungsten silicide layer 121 was formed on the nitride titanium layer 119 by using the method of sputter.

Figure 9E:
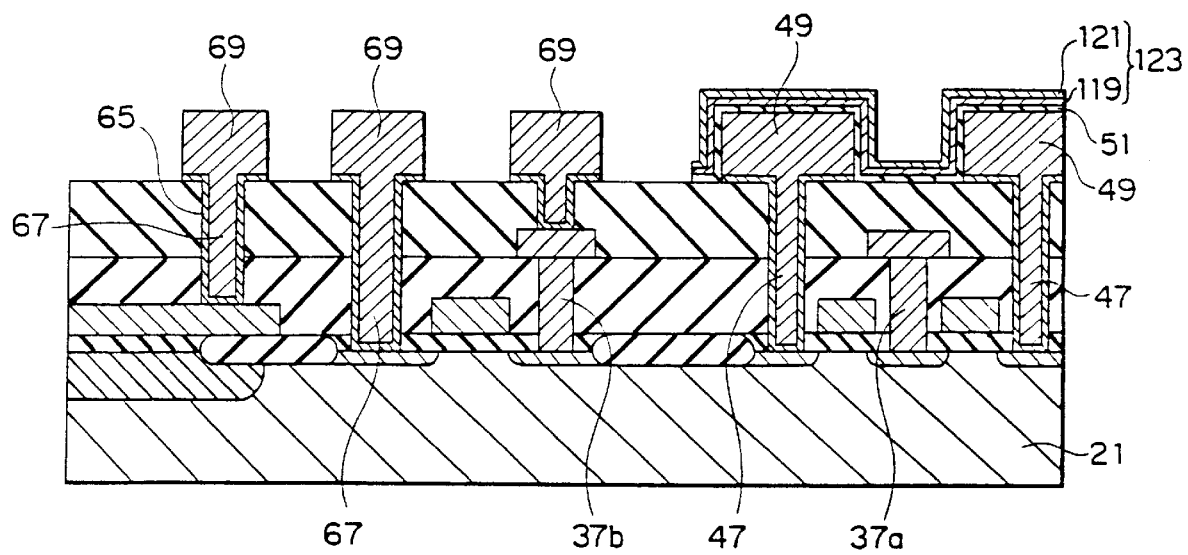

In FIG. 9(E), another cell plate electrode 123 was formed by using the method of dry etching. The cell plate electrode 123 has the nitride titanium layer 119 and the tungsten silicide layer 121.

Figure 9F:
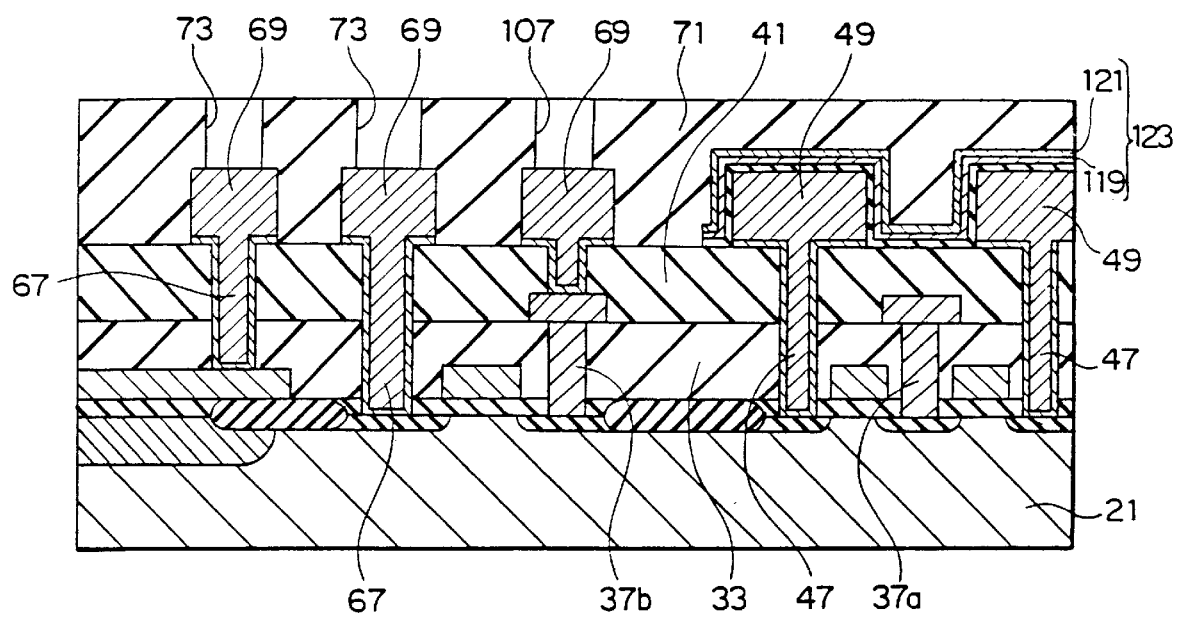

In FIG. 9(F), the fifth insulator layer 71 was formed by using the method of CVD and CMP. The fifth recessed surfaces 73 and the eleventh recessed surface 107 were formed by using the method of dry etching.

In FIG. 8, the third metal layers 75, the sixth metal layer 109, the fourth contact conductor plugs 77, the sixth contact conductor plug 111, the second metal layers 81, the second aluminum layers 83, and the third aluminum layers 113 were formed in the manner illustrated in FIG. 1.

In the semiconductor device illustrated in FIG. 8, inasmuch as a first thickness of the respective capacitor electrodes 49 is equal to a second thickness of the respective conductor pads 69, the surface of the fifth insulator layer 71 is substantially flat.

What is claimed is:
1. A method of manufacturing a semiconductor device, comprising the steps of:
   preparing a semiconductor substrate to have a principal surface;
   forming an impurity diffusion layer in a surface part of said semiconductor substrate to have impurities in said impurity diffusion layer which has an impurity diffusion surface;
   forming a first insulator layer on said principal surface and said impurity diffusion surface to have an upper insulator surface and a first recessed surface which defines a first contact hole exposing a first predetermined area of said impurity diffusion surface;
   filling a first contact conductor plug in said first contact hole to overlie said first predetermined area of said impurity diffusion surface and to be brought into contact with said first recessed surface, said first contact conductor plug having an upper plug surface;

forming a conductor pad on said upper plug surface and a predetermined surrounding area of said upper insulator surface to have an upper pad surface which is larger than said upper plug surface;

forming a second insulator layer on said upper insulator surface and said upper pad surface to have a second recessed surface which defines a second contact hole exposing a second predetermined area of said upper pad surface; and filling a second contact conductor plug in said second contact hole to overlie said second predetermined area of said upper pad surface and to be brought into contact with said second recessed surface.

2. A method of manufacturing a semiconductor device, comprising the steps of:

preparing a semiconductor substrate to have a principal surface;

forming an impurity diffusion layer on a surface part of said semiconductor substrate to have impurities in said impurity diffusion layer which has an impurity diffusion surface;

forming a first insulator layer on said principal surface and said impurity diffusion surface to have an upper insulator surface and a first recessed surface which defines a first contact hole exposing a predetermined area of said impurity diffusion surface;

filling a first contact conductor plug in said first contact hole to overlie said predetermined area of said impurity diffusion surface and to be brought into contact with said first recessed surface, said first contact conductor plug having an upper plug surface;

forming a second insulator layer on said upper insulator surface to have a second recessed surface which defines a second contact hole exposing said upper plug surface; and filling a second contact conductor plug in said second contact hole to overlie said upper plug surface and to be brought into contact with said second recessed surface.

3. A method of manufacturing a semiconductor device, comprising the steps of:

preparing a semiconductor substrate to have a principal surface;

forming an impurity diffusion layer in a surface part of said semiconductor substrate to have impurities in said impurity diffusion layer which has an impurity diffusion surface;

forming a first insulator layer on said principal surface and said impurity diffusion surface to have a first upper insulator surface;

forming a gate electrode on said first upper insulator surface to have an upper gate surface;

forming a second insulator layer on said first upper insulator surface and said upper gate surface to have a second upper insulator surface and a first recessed surface which defines a first contact hole exposing a first predetermined area of said upper gate surface, said first and said second insulator layers having a second recessed surface which defines a second contact hole exposing a second predetermined area of said impurity diffusion surface;

filling a first contact conductor plug in said first contact hole to overlie said first predetermined area of said upper gate surface, to be brought into contact with said first recessed surface, and to have a first upper plug surface;

filling a second contact conductor plug in said second contact hole to overlie said second predetermined area of said impurity diffusion surface, to be brought into contact with said second recessed surface, and to have a second upper plug surface;

forming a third insulator layer on said second upper insulator surface to have third and fourth recessed surfaces which define third and fourth contact holes exposing said first and said second upper plug surfaces and to have a third upper insulator surface;

filling a third contact conductor plug in said third contact hole to overlie said first upper plug surface and to be brought into contact with said third recessed surface; and filling a fourth contact conductor plug in said fourth contact hole to overlie said second upper plug surface and to be brought into contact with said fourth recessed surface.

4. A method of manufacturing a semiconductor device, comprising the steps of:

preparing a semiconductor substrate to have a principal surface;

forming an impurity diffusion layer in a surface part of said semiconductor substrate to have impurities in said impurity diffusion layer which has an impurity diffusion surface;

forming a first insulator layer on said principal surface and said impurity diffusion surface to have a first upper insulator surface;

forming a gate electrode on said first upper insulator surface to have an upper gate surface;

forming a second insulator layer on said first upper insulator surface and said upper gate surface, to have a second upper insulator surface and a first recessed surface which defines a first contact hole exposing a first predetermined area of said upper gate surface, said first and said second insulator layers having a second recessed surface which defines a second contact hole exposing a second predetermined area of said impurity diffusion surface;

filling a first contact conductor plug in said first contact hole to overlie said first predetermined area of said upper gate surface and to be brought into contact with said first recessed surface, said first contact conductor plug having a first upper plug surface;

filling a second contact conductor plug in said second contact hole to overlie said second predetermined area of said impurity diffusion surface and to be brought into contact with said second recessed surface, said second contact conductor plug having a second upper plug surface;

forming a first conductor pad on said first upper plug surface and a first predetermined surrounding area of said second upper insulator surface to have a first upper pad surface which is larger than said first upper plug surface;

forming a second conductor pad on said second upper plug surface and a second predetermined surrounding area of said second upper insulator surface to have a second upper pad surface which is larger than said second upper plug surface;

forming a third insulator layer on said second upper insulator surface and said first and said second upper pad surfaces to have third and fourth recessed surfaces which define third and fourth contact holes exposing first and second predetermined area of said first and said second upper pad surfaces;

filling a third contact conductor plug in said third contact hole to overlie said first predetermined area of said first upper pad surface and to be brought into contact with said third recessed surface; and filling a fourth contact conductor plug in said fourth contact hole to overlie said second predetermined area of said second upper pad surface and to be brought into contact with said fourth recessed surface.

* * * * *